United States Patent
Guo et al.

(10) Patent No.: US 12,391,596 B2
(45) Date of Patent: Aug. 19, 2025

(54) QUARTZ CONTAINER MANUFACTURING METHOD AND FORMING APPARATUS

(71) Applicant: LONGI GREEN ENERGY TECHNOLOGY CO., LTD., Shaanxi (CN)

(72) Inventors: Huaying Guo, Shaanxi (CN); Dong Han, Shaanxi (CN); Pan Liu, Shaanxi (CN); Yang Liu, Shaanxi (CN); Zheng Wang, Shaanxi (CN); Weikang Ren, Shaanxi (CN); Junxiang Zhou, Shaanxi (CN); Caihe Niu, Shaanxi (CN); Longlong Zhang, Shaanxi (CN)

(73) Assignee: LONGI GREEN ENERGY TECHNOLOGY CO., LTD., Shaanxi (CN)

( * ) Notice: Subject to any disclaimer, the term of this patent is extended or adjusted under 35 U.S.C. 154(b) by 337 days.

(21) Appl. No.: 17/928,045

(22) PCT Filed: Dec. 8, 2020

(86) PCT No.: PCT/CN2020/134607
§ 371 (c)(1),
(2) Date: Nov. 28, 2022

(87) PCT Pub. No.: WO2021/238143
PCT Pub. Date: Dec. 2, 2021

(65) Prior Publication Data
US 2023/0212054 A1    Jul. 6, 2023

(30) Foreign Application Priority Data
May 28, 2020 (CN) .......................... 202010471195.3

(51) Int. Cl.
*C03B 19/09* (2006.01)
*C03B 20/00* (2006.01)
(Continued)

(52) U.S. Cl.
CPC ............ *C03B 19/095* (2013.01); *C03B 20/00* (2013.01); *C03C 3/06* (2013.01); *C03C 2201/02* (2013.01); *C30B 15/10* (2013.01)

(58) Field of Classification Search
None
See application file for complete search history.

(56) References Cited

U.S. PATENT DOCUMENTS

| | | | |
|---|---|---|---|
| 4,956,208 A * | 9/1990 | Uchikawa | C30B 35/00 428/318.6 |
| 2003/0104920 A1 * | 6/2003 | Schwertfeger | C03B 19/06 501/80 |

(Continued)

FOREIGN PATENT DOCUMENTS

| | | |
|---|---|---|
| CN | 104150755 | 11/2014 |
| CN | 104402204 | 3/2015 |

(Continued)

OTHER PUBLICATIONS

CN 205115269 original and machine translation (Year: 2016).*

(Continued)

*Primary Examiner* — Alison L Hindenlang
(74) *Attorney, Agent, or Firm* — NIXON PEABODY LLP; Jeffrey L. Costellia

(57) ABSTRACT

A quartz container manufacturing method and a forming apparatus, relating to the solar photovoltaic technical field, and providing a mold comprising a top cylinder and a mold bottom; during formation of a container blank, when the mold forms a first included angle with a horizontal plane and the mold is rotated at a first rotation speed, the source material forms a first blank on the inner wall of the top cylinder; when the mold forms a second included angle with the horizontal plane and the mold is rotated at a second rotation speed, the source material forms a second blank on (Continued)

the inner wall of the mold bottom; a quartz container is manufactured from a container blank composed of the first blank and the second blank.

10 Claims, 3 Drawing Sheets

(51) Int. Cl.
*C03C 3/06* (2006.01)
*C30B 15/10* (2006.01)

(56) References Cited

U.S. PATENT DOCUMENTS

| | | | |
|---|---|---|---|
| 2004/0237588 A1* | 12/2004 | Schwertfeger | C30B 15/10 65/17.3 |
| 2008/0156631 A1 | 7/2008 | Fair et al. | |
| 2010/0314400 A1* | 12/2010 | Kanda | C30B 15/10 220/669 |
| 2021/0108329 A1* | 4/2021 | Baba | C30B 35/002 |

FOREIGN PATENT DOCUMENTS

| | | | | |
|---|---|---|---|---|
| CN | 205115269 U | * | 3/2016 | |
| CN | 103827048 | | 5/2017 | |
| CN | 108059325 | | 5/2018 | |
| CN | 109112613 | | 1/2019 | |
| CN | 208846949 | | 5/2019 | |
| CN | 210190082 U | * | 3/2020 | |
| CN | 212800128 U | * | 3/2021 | |
| CN | 218785659 U | * | 4/2023 | |
| JP | S5738398 A | * | 3/1982 | C03C 20/00 |
| JP | 2005289710 A | * | 10/2005 | C03B 19/095 |
| JP | 2015-147688 | | 8/2015 | |
| KR | 20140100445 A | * | 8/2014 | C03B 19/095 |

OTHER PUBLICATIONS

CN 210190082 original and machine translation (Year: 2020).*
CN 212800128 original and machine translation (Year: 2021).*
CN 218785659 original and machine translation (Year: 2023).*
International Search Report for Application No. PCT/CN2020/134607, mailed Mar. 10, 2021 (4 pages).
India Office Action for Application No. 202227075945, mailed Mar. 1, 2023 (5 pages).
Chinese Office Action for App. No. 202010471195.3, mailed Jan. 31, 2024 (13 pages).

* cited by examiner

US 12,391,596 B2

QUARTZ CONTAINER MANUFACTURING METHOD AND FORMING APPARATUS

CROSS-REFERENCES TO RELATED APPLICATIONS

This application claims priority to the Chinese patent application No. 202010471195.3 entitled "QUARTZ CRUCIBLE MANUFACTURING METHOD AND FORMING APPARATUS" filed in the China National Intellectual Property Administration on May 28, 2020, which is incorporated herein by reference in its entirety.

TECHNICAL FIELD

The present disclosure relates to the technical field of solar photovoltaic, in particular to a manufacturing method of a quartz container and a molding device.

BACKGROUND

In a process of producing monocrystalline silicon by a Czochralski method, it is necessary to place polycrystalline silicon raw materials in a quartz crucible or other containers, and heat them to form a molten polycrystalline silicon solution, and then a monocrystalline silicon stick can be pulled and obtained from the molten polycrystalline silicon solution. As a main container in a manufacturing process of the monocrystalline silicon, a quartz container plays a vital role in the process of producing the monocrystalline silicon.

In related art, the quartz container is mainly produced by using an electric arc method. Firstly, raw materials (such as quartz sand) are poured into an inclined and rotating mold, and a container green body is formed on an inner wall of the mold by using a molding piece through rotation of the mold. Then, the container green body is burned by a high-temperature electric arc emitted by a graphite electrode, and melted for a certain period of time so as to obtain a container blank, which is then cut and cleaned to obtain the quartz container.

The mold includes a side wall and a mold bottom. In a process of forming the container green body, the raw materials easily slide down to a center position of the bottom under the action of gravity, and it is difficult to form a complete container green body, resulting in a lower molding rate of the container green body and a lower manufacturing efficiency of the quartz container.

SUMMARY

A manufacturing method of a quartz container and a molding device are provided in this disclosure, which aim at solving a problem that raw materials easily slide down to a central position of a mold bottom in the manufacturing process of a quartz container, which results in a low molding rate of a container green body, and a reduced manufacturing efficiency of the quartz container.

In a first aspect, a manufacturing method of a quartz container is provided in an embodiment of the present disclosure, which includes:
  providing a mold, a molding piece and a raw material, the mold including a top cylinder and a mold bottom connected with each other, the top cylinder being provided with an opening and the mold bottom being away from the opening;
  forming the raw material into a first green body on an inner wall of the top cylinder through the molding piece in a case where a first included angle is formed between an axis of the mold and a horizontal plane and the mold rotates around the axis at a first rotational speed;
  forming the raw material into a second green body on an inner wall of the mold bottom through the molding piece in a case where a second included angle is formed between the axis and the horizontal plane and the mold rotates around the axis at a second rotational speed; and
  manufacturing the quartz container with a container green body composed of the first green body and the second green body.

Optionally, the raw material provided includes a first raw material and a second raw material:
  before forming the first green body, the first raw material is added into the mold so as to form the first raw material into the first green body; and
  before forming the second green body, the second raw material is added into the mold so as to form the second raw material into the second green body.

Optionally, the first included angle is greater than or equal to 45 degrees and less than or equal to 75 degrees, and the first rotational speed is greater than or equal to 60 revolutions per minute and less than or equal to 75 revolutions per minute.

Optionally, the second included angle is greater than the first included angle, and the second rotational speed is greater than or equal to 50 revolutions per minute and less than or equal to 60 revolutions per minute.

Optionally, the mold bottom is a cone.

Optionally, the inner wall of the top cylinder is transitioned to and connected with the inner wall of the cone by an arc, and an inner side of a bottom of the cone is of an arc curved surface.

Optionally, the molding piece includes a first member, a second member and a positioning member; and
  an end of the first member is connected with a first end of the second member, and the positioning member is installed at a second end of the second member. The positioning member is matched with the bottom of the cone, so that the first member is matched with the inner wall of the top cylinder to mold the first green body, and the second member is matched with the inner wall of the cone to mold the second green body in conical barrel shape.

Optionally, a first straight wall is formed on a side of the first member close to the top cylinder, and a second straight wall is formed on a side of the second member close to the cone, the first straight wall intersects with the second straight wall at a preset included angle.

Optionally, the first straight wall is transitioned to and connected with the second straight wall by an arc segment.

In a second aspect, a molding device is provided in an embodiment of the present disclosure, which includes the mold and the molding piece as described in the above embodiment.

In the embodiment of this disclosure, the mold includes a top cylinder and a mold bottom connected with each other. In a process of forming the container green body, when the mold forms the first included angle with the horizontal plane and rotates at the first rotational speed, the raw material is formed into the first green body on the inner wall of the top cylinder, and when the mold forms the second included angle with the horizontal plane and rotates at the second rotational speed, the raw material is formed into the second green body on the inner wall of the mold bottom. The quartz container is manufactured by the container green body composed of the first green body and the second green body, which may prevent the raw material from slipping to the center position of the mold bottom under the action of gravity, improve the molding rate of the container green body, and further improve the manufacturing efficiency of the quartz container.

The above description is only a summary of technical schemes of the present disclosure, which can be implemented according to contents of the specification in order to better understand technical means of the present disclosure; and in order to make the above and other objects, features and advantages of the present disclosure more obvious and understandable, a detailed description of the present disclosure is particularly provided in the following text.

BRIEF DESCRIPTION OF THE DRAWINGS

In order to explain embodiments of the present disclosure more clearly, the drawings required in the description of the embodiments of the present disclosure will be briefly introduced below: obviously, the drawings in the following description are only some embodiments of the present disclosure, and other drawings can be obtained according to these drawings by those of ordinary skill in the art without paying creative labor.

DESCRIPTION OF REFERENCE NUMERALS

201—Top Cylinder, 202—Mold Bottom, 203—Axis, 204—Horizontal Plane, 205—First Included Angle, 206—Vacuum Hole, 207—Arc Connection Segment, 208—Arc Curved Surface, 401—First Member, 402—Second Member, 4021—Arc Segment, 403—Positioning Member, 404—Handle.

DETAILED DESCRIPTION OF THE EMBODIMENTS

In the following, the technical scheme in the embodiment of the present disclosure will be described clearly and completely in connection with the drawings: obviously, the described embodiment is intended to be a part of the embodiment of the present disclosure, but not all of them. On a basis of the embodiments in this disclosure, all other embodiments obtained by the ordinary skilled in the art without paying creative effort are within a protection scope of this disclosure.

Figure 1:
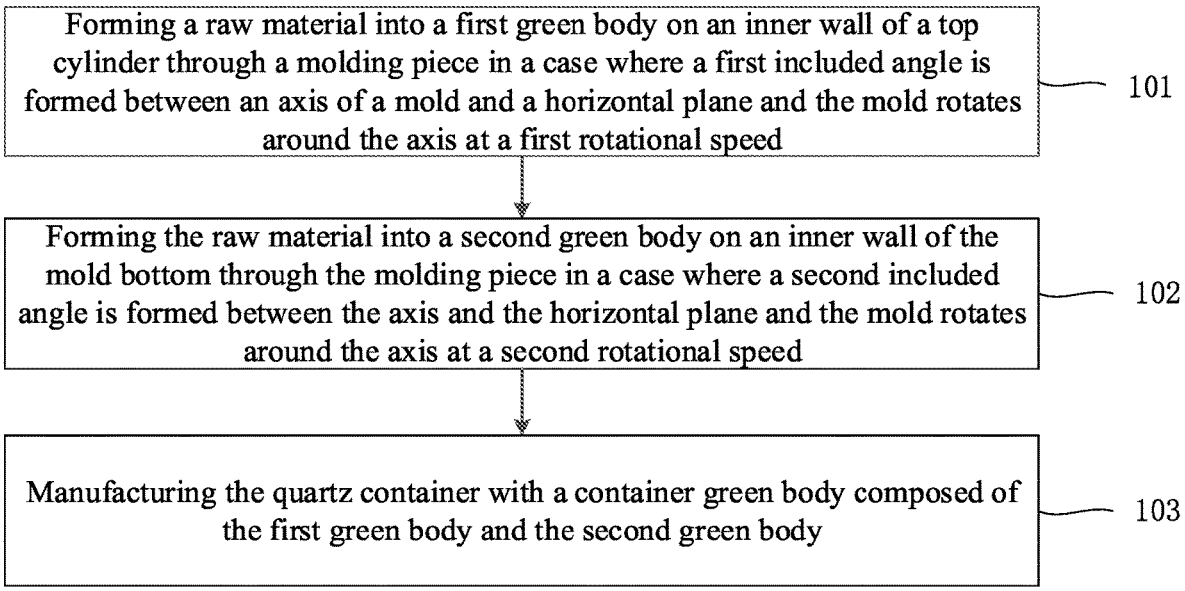
FIG. 1 shows a flow chart of steps of a manufacturing method of a quartz, container according to an embodiment of the present disclosure.

Referring to FIG. 1. FIG. 1 shows a flow chart of steps of a manufacturing method of a quartz container according to an embodiment of the present disclosure, this method may be applied to manufacturing of the quartz container, and may include Steps 101 to 103.

Step 101, forming a raw material into a first green body on an inner wall of a top cylinder through a molding piece in a case where a first included angle is formed between an axis of a mold and a horizontal plane and the mold rotates around the axis at a first rotational speed.

Figure 2:
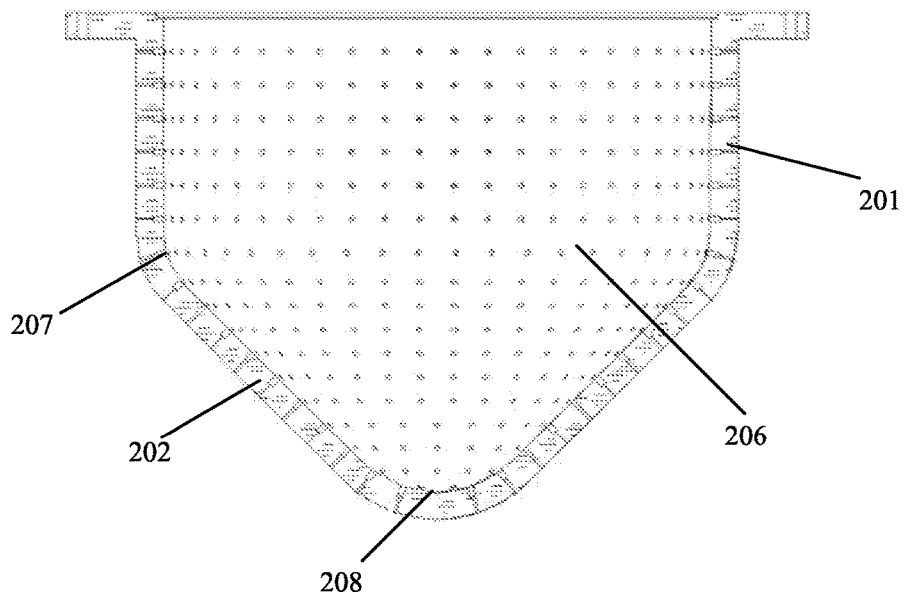
FIG. 2 shows a schematic structural diagram of a mold according to an embodiment of the present disclosure.

In this embodiment, a mold, a molding piece and the raw material are provided, and the raw material is formed into a container green body on an inner wall of the mold through cooperation of the mold and the molding piece. The mold includes a top cylinder and a mold bottom connected with each other. As shown in FIG. 2, which shows a schematic structural diagram of a mold according to the embodiment of the present disclosure, the mold includes a top cylinder 201 and a mold bottom 202, an end of the top cylinder 201 is fixedly connected with the mold bottom 202, and the other end of the top cylinder 201 away from the mold bottom 202 is provided with an opening, and the top cylinder 201 and the mold bottom 202 form a mold with one end open.

The mold is installed in a molding device, and the molding device includes a tilting mechanism and a rotating mechanism. The tilting mechanism is configured for adjusting a tilting angle of the mold, and the rotating mechanism is configured for driving the mold to rotate around an axis. A specific structure of the molding device may be referred to in the related art, and is not limited in this embodiment.

Figure 3:
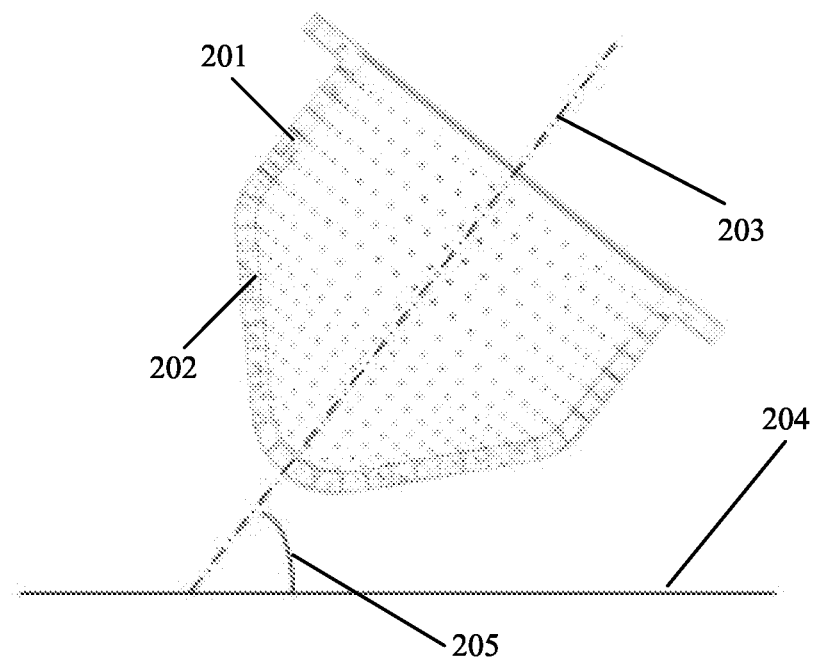
FIG. 3 shows an inclined schematic diagram of a mold according to an embodiment of the present disclosure.

In a manufacturing process of the quartz container, firstly, the mold can be in a tilted state by the tilting mechanism, as shown in FIG. 3, which shows a tilting schematic diagram of a mold according to the embodiment of the present disclosure. By the tilting mechanism, a first included angle 205 may be formed between the axis 203 of the mold and the horizontal plane 204. The first included angle 205 may be 50 degrees. 60 degrees or 70 degrees, for example. A specific value of the first included angle may be set as desired, and is not limited in this embodiment. Meanwhile, the mold may be driven to rotate by the rotating mechanism, so that the mold may rotate around the axis 203 at a first rotational speed. The first rotational speed may be 60, 65 or 70 revolutions per minute, for example. A specific value of the first rotational speed can be set as desired, and is not limited in this embodiment.

In this embodiment, the raw material may be added into the mold through a feeding device, for example, raw material quartz sand is added to the inner wall of the top cylinder 201 in a case where the first included angle is formed between the axis of the mold and the horizontal plane and the mold rotates around the axis at the first rotational speed. A process of adding the raw material into the mold and components of the raw material may be set as desired, and is not limited in this embodiment.

Figure 4:
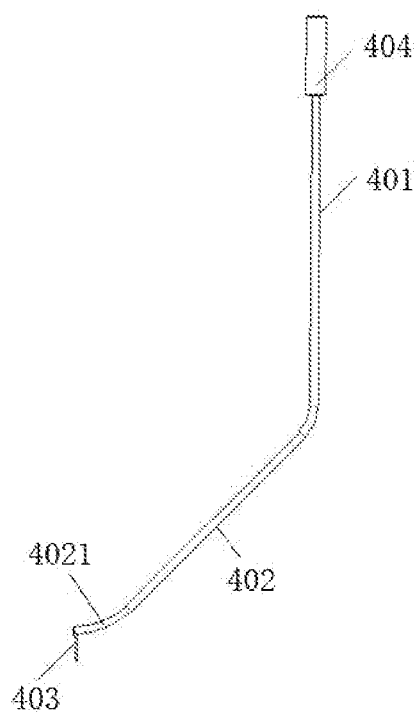
FIG. 4 shows a structural schematic diagram of a molding piece according to an embodiment of the present disclosure.

Referring to FIG. 4. FIG. 4 shows a schematic structural diagram of a molding piece according to the embodiment of the present disclosure, the molding piece includes a first member 401, a second member 402, and a positioning member 403. An end of the first member 401 is connected with a first end of the second member 402, and the positioning member 403 is installed at a second end of the second member 402. Accordingly, a bottom of the mold (i.e., a bottom of the mold bottom 202) may be provided with a positioning hole. After the raw material is added, with the first included angle kept constant, the mold rotates at the first rotational speed, and the positioning member 403 is matched with the positioning hole. During rotation of the mold, the raw material is formed into the first green body on the inner wall of the top cylinder 201 through the molding piece. A process of forming the raw material into the first green body on the inner wall of the top cylinder through the molding piece may be referred to in the related art, and is not limited in this embodiment.

Step 102, forming the raw material into a second green body on an inner wall of the mold bottom through the molding piece in a case where a second included angle is formed between the axis and the horizontal plane and the mold rotates around the axis at a second rotational speed.

In this embodiment, after the first green body is formed, the second included angle may be formed between the axis 203 of the mold and the horizontal plane 204 by the tilting mechanism, and the mold may be rotated by the rotating mechanism around the axis at the second rotational speed. For example, the second included angle may be 80 degrees. 85 degrees or 90 degrees, and the second rotation speed may be 50 revolutions per minute or 55 revolutions per minute. Specific values of the second included angle and the second rotation speed may be set as desired, and are not limited in this embodiment.

Referring to step 101, during rotation of the mold at the second rotational speed, the molding piece is matched with the mold, so that remaining raw material is formed into the second green body on the inner wall of the mold bottom 202. A process of forming the second green body on the inner wall of the mold bottom by the molding piece may be referred to in the related art, and is not limited in this embodiment.

Step 103, manufacturing the quartz container with a container green body composed of the first green body and the second green body.

In this embodiment, the first green body and the second green body constitute the container green body. After the container green body is formed, the molding device may be moved to a melting chamber, a vacuum degree of the melting chamber may be controlled, and the container green body may be melted by a high-temperature arc generated by a graphite electrode so as to obtain the container blank. After the container blank is obtained, the container blank is cut and cleaned to obtain the quartz container. A process of manufacturing the quartz container through the container blank may be referred to in the related art, and is not limited in this embodiment.

In the embodiment of this disclosure, the mold includes the top cylinder and the mold bottom connected with each other. In the process of forming the container green body, when the mold forms the first included angle with the horizontal plane and rotates at the first rotational speed, the raw material is formed into the first green body on the inner wall of the top cylinder, and when the mold forms the second included angle with the horizontal plane and rotates at the second rotational speed, the raw material is formed into the second green body on the inner wall of the mold bottom. The quartz container is manufactured by the container green body composed of the first green body and the second green body, which may prevent the raw material from slipping to the center position of the mold bottom under the action of gravity, improve the molding rate of the container green body, and further improve the manufacturing efficiency of the quartz container.

Figure 5:
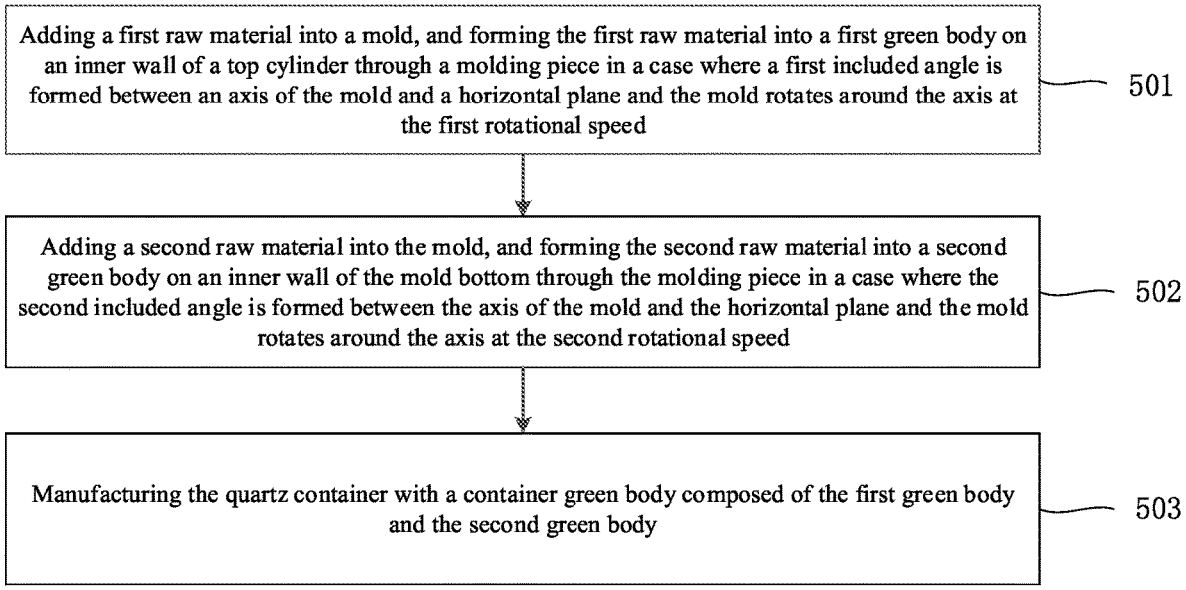
FIG. 5 shows a flow chart of steps of another manufacturing method of a quartz container according to an embodiment of the present disclosure.

Referring to FIG. 5. FIG. 5 shows a flow chart of steps of a manufacturing method of a quartz container according to an embodiment of the present disclosure, this method can be applied to manufacturing of the quartz container, and may include Steps 501 to 503.

Step 501, adding a first raw material into a mold, and forming the first raw material into a first green body on an inner wall of a top cylinder through a molding piece in a case where a first included angle is formed between an axis of the mold and a horizontal plane and the mold rotates around the axis at a first rotational speed.

In this embodiment, the raw material may be added into the mold step by step, and the raw material include a first raw material for forming a first green body and a second raw material for forming a second green body. Specifically, only the first raw material is added to an inner wall of the top cylinder 201 and the first green body may be formed by the first raw material in a case where the first included angle is formed between the axis of the mold and the horizontal plane and the mold rotates around the axis at the first rotational speed. A specific process of forming the first green body may be referred to in the above example, and is not limited in this embodiment.

Optionally, the first included angle is greater than or equal to 45 degrees and less than or equal to 75 degrees, and the first rotational speed is greater than or equal to 60 revolutions per minute and less than or equal to 75 revolutions per minute.

Combined with above examples, the tilting mechanism may be adjusted to make the first included angle greater than or equal to 45 degrees and less than or equal to 75 degrees, such as 45 degrees. 50 degrees. 60 degrees. 70 degrees or 75 degrees, and the rotating mechanism may be adjusted to make the first rotational speed greater than or equal to 60 revolutions per minute and less than or equal to 75 revolutions per minute, such as 60 revolutions per minute. 65 revolutions per minute. 68 revolutions per minute or 70 revolutions per minute. In a process of forming the first green body, the mold is tilted to the first included angle and rotates at the second rotational speed, which can prevent the raw material (the first raw material) from slipping to a center position of a mold bottom under the action of gravity, improve the molding rate of the container green body, and further improve the manufacturing efficiency of the quartz container.

In practical applications, when the mold bottom is the cone as shown in FIG. 2, in the process of forming the first green body, the raw material in the mold easily slides down to a bottom of the cone under the action of gravity, and it is difficult to form the first green body, resulting in a low molding rate of the first green body. The first included angle is adjusted to be between 45 and 75 degrees and the first rotational speed is adjusted to be between 60 and 75 revolutions per minute, which can prevent the raw material from sliding down to the bottom of the cone and improve the molding rate of the first green body.

Step 502, adding a second raw material into the mold, and forming the second raw material into a second green body on an inner wall of the mold bottom through the molding piece in a case where the second included angle is formed between the axis of the mold and a horizontal plane and the mold rotates around the axis at the second rotational speed.

In this embodiment, when the first green body is formed, the tilting mechanism is adjusted to make the axis of the mold form the second included angle with the horizontal plane, and the 4920 May 16-918-1 rotating mechanism is adjusted to make the mold rotate around the axis at the second rotational speed, the second raw material may be added into the mold, for example the second raw material is directly added to the inner wall of the mold bottom 202. During rotation of the mold, the second raw material is formed into the second green body on the inner wall of the mold bottom by the molding piece.

Optionally, the second included angle is greater than the first included angle, and the second rotational speed is greater than or equal to 50 revolutions per minute and less than or equal to 60 revolutions per minute.

In this embodiment, in the process of forming the second green body, the mold may be adjusted so that the second included angle is greater than the first included angle, and the second rotational speed is between 50 revolutions per minute and 60 revolutions per minute. For example, the second rotational speed may be adjusted to 50 revolutions per minute. 55 revolutions per minute or 60 revolutions per minute, which may prevent the raw material from sliding down to the bottom of the cone.

Step 503, manufacturing the quartz container with a container green body composed of the first green body and the second green body.

In the embodiment of the present disclosure, in the process of forming the green body of the quartz container, the first included angle is set to be greater than or equal to 45 degrees and less than or equal to 75 degrees, and the first rotational speed is set to be greater than or equal to 60 revolutions per minute and less than or equal to 75 revolutions per minute. In the process of forming the first green body, the mold is tilted to the first included angle and rotates at the first rotational speed, which may prevent the raw material from slipping to the center position of the mold bottom under the action of gravity, improve the molding rate of the container green body, and further improve the manufacturing efficiency of the quartz container. Meanwhile, when the first green body is formed, only the first raw material for forming the first green body is added, which may avoid adding too many raw materials, reduce the weight of the raw material, prevent the raw material from sliding down to the bottom, and thus improve stability of the first green body.

It should be noted that, for sake of simple description, the method embodiments are all expressed as combination of a series of actions, but it should be known by those skilled in the art that the embodiments of the present disclosure are not limited by a sequence of the described actions, because some of the steps can be performed in other sequences or simultaneously according to the embodiments of the present disclosure. Secondly, it also should be known by those skilled in the art that the embodiments described in the specification are all preferred embodiments, and the actions involved are not necessarily necessary for the embodiments of the present disclosure.

Referring to FIG. 2, a mold is provided in this embodiment, and the mold bottom is a cone.

As shown in FIG. 2, the mold includes a top cylinder 201 and a mold bottom 202. The top cylinder 201 is cylindrical and the mold bottom 202 is the cone. The cone is a hollow cone, and a top surface of the cone is provided with an opening for connecting with the top cylinder 201. An end of the top cylinder 201 is connected with an end of the cone 202 provided with an opening, and an end of the top cylinder 201 away from the cone 202 is provided with an opening, and the top cylinder 201 and the cone 202 constitute a mold with one end open. The mold may be made of graphite or other high-temperature resistant materials.

Combined with above examples, when the mold bottom is a cone, in the manufacturing process of the quartz container, a cylindrical first green body may be formed on an inner wall of the top cylinder 201, and a conical second green body may be formed on an inner wall of the cone 202, so that the quartz container with a conical bottom can be manufactured. A use method of the mold can be referred to in the above examples, and is not limited in this embodiment.

Optionally, an inner wall of the top cylinder is transitioned to and connected with the inner wall of the cone by an arc, and an inner side of a bottom of the cone is of an arc curved surface.

As shown in FIG. 2, an arc connecting segment 207 may be provided between the inner wall of the top cylinder 201 and an inner wall of the mold bottom 202, so that the inner wall of the top cylinder 201 is transitioned to and connected with the inner wall of the mold bottom 202 by the arc. When the inner wall of the top cylinder 201 is transitioned to and connected with the inner wall of the mold bottom 202 by the arc, connection between an inner side of a sidewall and an inner side of a bottom of the manufactured quartz container is arc-shaped. When the inner side of the sidewall is transitioned to the inner side of the bottom of the quartz container by using the arc, a friction force between silicon material and the inner wall of the quartz container may be reduced, and service life of the container may be prolonged.

As shown in FIG. 2, the inside of the bottom of the cone 202 may be of an arc curved surface 208, and the inside of the bottom of the cone 202 may be arc-shaped, so that the bottom of the manufactured quartz container is of an arc curved surface. During use of the quartz container, when the bottom of the quartz container is of the arc curved surface, a stress area of the bottom of the quartz container may be increased, and stability of the quartz container may be improved. Moreover, with the arc curved surface, hard contact between the bottom of the quartz container and other objects may be avoided, and durability of the quartz container may be improved. In practice use, an outer wall of the cone may also be provided to be arc-shaped so as to improve stability of the mold.

Optionally, the inner side of the bottom of the cone may be of a spherical or ellipsoidal surface.

In this embodiment, the inner side of the bottom of the cone may be of the spherical or ellipsoidal surface, and the spherical or ellipsoidal surface may further increase an area of the inner wall of the mold, thereby increasing an area of the bottom of the manufactured quartz, container and improving the stability of the quartz container.

Optionally, a plurality of vacuum holes 206 may be provided in the mold at intervals. As shown in FIG. 3, the vacuum holes 206 may be uniformly arranged on the top cylinder 201 and the bottom 202 of the mold around the axis 203. A specific structure and use method of the vacuum holes may be referred to in the related art, and are not limited in this embodiment.

In this embodiment, the mold bottom is a cone, and a quartz container with a cone-shaped bottom may be manufactured by the mold with the cone.

Referring to FIG. 4, a molding piece is provided in this embodiment. The molding piece includes a first member, a second member and a positioning member.

As shown in FIG. 4, an end of the first member 401 is connected to a first end of the second member 402, and the positioning member 403 is installed at a second end of the second member 402. The positioning member 403 is matched with the bottom of the cone 202, so that the first member 401 is matched with the inner wall of the top cylinder 201 to mold the first green body; and the second member 402 is matched with the inner wall of the cone 202 to mold the second green body.

In this embodiment, the first member 401 and the second member 402 may be straight cylinders, prisms or plates, or other structures. The first end and the second end of the second member 402 are opposite ends, the first end of the second member 402 is configured for connecting the first member 401, and the second end is configured for connecting the positioning member 403. The positioning member 403 may be arranged at a side of the second member 402 close to an inner wall of the mold bottom 202, so as to facilitate matching of the positioning member with the mold bottom 202. An end of the positioning member 403 away from the second member 402 may be provided with a tapered tip, the tapered tip is used to cooperate with the mold bottom to fix the molding piece. Meanwhile, a handle 404 may be provided at an end of the first member away from the second member to facilitate pulling of the molding piece.

Combined with the above examples, the positioning member 403 is configured to cooperate with the cone 202, and connection between the first member and the second member is at an angle, so that the first green body is formed on the inner wall of the top cylinder 201 by the first member 401, and the second green body is formed on the inner wall of the cone 202 by the second member 402. Meanwhile, a side of the second member 402 close to the cone may be made straight or flat, so that the second green body obtained by molding from the second member 402 may be a conical cylindrical green body. Specific structures and shapes of the first member, the second member and the positioning member may be set as desired, as long as the second green body obtained by molding from the second member is the conical cylindrical green body. A process of forming the first green body and the second green body by matching the molding piece with the mold may be referred to in the above examples, and is not limited in this embodiment.

For example, a first straight wall is formed on the side of the first member 401 close to the top cylinder 201, and a second straight wall is formed on the side of the second member 402 close to the cone 202. The first straight wall intersects with the second straight wall at a preset included angle.

For example, as shown in FIG. 4, both the first member 401 and the second member 402 are cylinders, and an axis of the first member 401 and an axis of the second member 402 intersect at a preset angle. A side of the first member 401 close to the top cylinder 201 is straight (the first straight wall), and a side of the second member 402 close to the cone 202 is also straight (the second straight wall). In a manufacturing process of the quartz container, the mold rotates, and under the action of the second member 402, the raw material in the mold may be molded on the inner wall of the cone 202 to obtain the second green body. The preset angle may be set as desired, and is not limited in this embodiment.

Optionally, a second end of the second member is provided with an arc segment, and the arc segment is matched with the mold, so that a bottom of the second green body is of an arc curved surface.

Combined with the above examples, a second end of the second member 402 may be provided with an arc segment 4021, and the arc segment 4021 is matched with the inner wall of the cone 202, so that the bottom of the molded second green body is of an arc curved surface, and further, the bottom of the manufactured quartz container may be of an arc curved surface. When the bottom of the quartz container is of the arc curved surface, a stress area of the bottom of the quartz container may be increased, and stability of the quartz container may be improved. Moreover, with the arc curved surface, hard contact between the bottom of the quartz container and other objects may be avoided, and durability of the quartz container may be improved.

Optionally, the first straight wall is transitioned to and connected with the second straight wall by an arc segment.

Combined with the above examples, a side of the first member 401 close to the inner wall of the top cylinder 201 is transitioned to and connected with a side of the second member 402 close to the inner wall of the cone 202 by an arc. When the first member 401 is transitioned to and connected with the second member 402 by the arc, connection between the side wall and the bottom of the manufactured quartz container may be arc-shaped. When the side wall is transitioned to the bottom by the arc, a friction force between silicon material and the inner wall of the quartz, container may be reduced, and service life of the container may be prolonged.

In this embodiment, the molding piece is matched with the mold, so that a quartz container with a conical tube shape can be manufactured.

A molding device is provided in an embodiment of the present disclosure, which includes the mold and the molding piece as described in the above embodiments.

In this embodiment, the molding device is configured for molding the container green body, and the molding device may include the mold and the molding piece as described in the above embodiment, as well as the tilting mechanism and the rotating mechanism.

The molding device may further include a feeding mechanism for feeding the raw material into the mold, and the feeding mechanism may include a feeding amount control module, the feeding amount control module is configured for controlling feeding amount in a feeding process. The feeding mechanism may also include a feeding amount calculation module, the feeding amount calculation module is configured to calculate the feeding amount in the feeding process according to a shape and thickness of the green body. Combined with the above examples, the feeding amount calculation module may calculate a mass of a total raw material added to the mold during the feeding process. The feeding amount calculation module can calculate a mass of the first raw material and a mass of the second raw material added to the mold during the feeding process.

It is noted that terms "comprising". "including" or any other variation thereof herein are intended to encompass a non-exclusive inclusion, so that a process, method, article or device including a series of elements includes not only those elements, but also other elements not explicitly listed, or elements inherent to such a process, method, article or device. Without further restrictions, an element defined by the statement "includes a . . . " does not exclude presence of other identical elements in the process, method, article or device including the element.

The embodiments of the present disclosure have been described with reference to the drawings, but the present disclosure is not limited to the specific embodiments described above, which are merely illustrative rather than restrictive. Many forms can be made by those skilled in the art without departing from spirit of the present disclosure and the scope of the claims upon inspiration of the present disclosure, all of which are within the scope of the present disclosure.

The above-described apparatus embodiments are only schematic, in which units described as separate components may or may not be physically separated, and the components shown as the units may or may not be physical units, that is, they may be located in one place or distributed over multiple network units. Some or all of the modules can be selected according to actual needs to achieve purposes of this embodiment. The embodiments can be understood and implemented by the ordinary skilled in the art without paying creative labor.

Reference to "one embodiment", "an embodiment" or "one or more embodiments" herein means that a specific feature, structure or characteristic described in connection with embodiments is included in at least one embodiment of the present disclosure. In addition, it is noted that an example of a word "in one embodiment" here do not necessarily refer to a same embodiment.

In the specification provided here, numerous specific details are set forth. However, it can be understood that the embodiments of the present disclosure can be practiced without these specific details. In some instances, well-known methods, structures and techniques have not been shown in detail in order not to obscure understanding of this specification.

In the claims, any reference signs between parentheses shall not be construed as limitations on the claims. A word "comprising" does not exclude presence of elements or steps not listed in a claim. A word "a" or "an" preceding an element does not exclude presence of a plurality of such elements. The present disclosure can be realized by means of hardware including several different elements and by means of a suitably programmed computer. In a unit claim enumerating several devices, several of these devices can be embodied by a same item of hardware. Use of words "first", "second", "third", etc, does not indicate any order. These words can be interpreted as names.

Finally, it should be noted that the above embodiments are only intended to illustrate technical schemes of the present disclosure, but not to limit it. Although the present disclosure has been described in detail with reference to the foregoing embodiments, it should be understood by ordinary skilled in the art that modifications can be made to the technical schemes described in the foregoing embodiments, or equivalent substitutions can be made to some technical features thereof. These modifications or substitutions do not make essence of corresponding technical schemes depart from the spirit and scope of the technical schemes of the embodiments of this disclosure.

The invention claimed is:

1. A manufacturing method of a quartz container, comprising:
   providing a mold, a molding piece and a raw material, wherein the mold includes a top cylinder and a mold bottom connected with each other, the top cylinder is provided with an opening and the mold bottom is away from the opening, and the mold bottom is a cone;
   forming the raw material into a first green body on an inner wall of the top cylinder through the molding piece in a case where a first included angle is formed between an axis of the mold and a horizontal plane and the mold rotates around the axis at a first rotational speed;
   forming the raw material into a second green body on an inner wall of the mold bottom through the molding piece in a case where a second included angle is formed between the axis and the horizontal plane and the mold rotates around the axis at a second rotational speed;
   and manufacturing the quartz container with a container green body composed of the first green body and the second green body;
   wherein the molding piece comprises a first member, a second member and a positioning member; and
   an end of the first member is connected with a first end of the second member, and the positioning member is installed at a second end of the second member; and the positioning member is matched with the bottom of the cone, so that the first member is matched with the inner wall of the top cylinder to mold the first green body, and the second member is matched with the inner wall of the cone to mold the second green body in a conical barrel shape; and
   wherein the first included angle is greater than or equal to 45 degrees and less than or equal to 75 degrees, and the first rotational speed is greater than or equal to 60 revolutions per minute and less than or equal to 75 revolutions per minute.

2. The method according to claim 1, wherein
   the raw material provided comprises a first raw material and a second raw material;
   before forming the first green body, the method further comprises:
   adding the first raw material into the mold so as to form the first raw material into the first green body; and
   before forming the second green body, the method further comprises:
   adding the second raw material into the mold so as to form the second raw material into the second green body.

3. The method according to claim 1, wherein the second included angle is greater than the first included angle, and the second rotational speed is greater than or equal to 50 revolutions per minute and less than or equal to 60 revolutions per minute.

4. The method according to claim 1, wherein the inner wall of the top cylinder is transitioned to and connected with the inner wall of the cone by an arc, and an inner side of a bottom of the cone is of an arc curved surface.

5. The method according to claim 1, wherein a first straight wall is formed on a side of the first member close to the top cylinder, and a second straight wall is formed on a side of the second member close to the cone, and the first straight wall intersects with the second straight wall at a preset included angle.

6. The method according to claim 5, wherein the first straight wall is transitioned to and connected with the second straight wall by an arc segment.

7. A molding device, comprising:
   a mold,
   wherein the mold comprises a top cylinder and a mold bottom connected with each other, the top cylinder is provided with an opening and the mold bottom is away from the opening, and the mold bottom is a cone; and
   a molding piece, wherein the molding piece comprises a first member, a second member and a positioning member;
   wherein an end of the first member is connected with a first end of the second member, and the positioning member is installed at a second end of the second member; and the positioning member is matched with the bottom of the cone, so that the first member is matched with the inner wall of the top cylinder to mold the first green body, and the second member is matched with the inner wall of the cone to mold the second green body in a conical barrel shape.

8. The molding device according to claim 7, wherein the inner wall of the top cylinder is transitioned to and connected with the inner wall of the cone by an arc, and an inner side of a bottom of the cone is of an arc curved surface.

9. The molding device according to claim 7, wherein a first straight wall is formed on a side of the first member close to the top cylinder, a second straight wall is formed on a side of the second member close to the cone, and the first straight wall intersects with the second straight wall at a preset included angle.

10. The molding device according to claim 9, wherein the first straight wall is transitioned to and connected with the second straight wall by an arc segment.

\* \* \* \* \*